United States Patent [19]

Feenstra

[11] Patent Number: 5,781,411
[45] Date of Patent: Jul. 14, 1998

[54] HEAT SINK UTILIZING THE CHIMNEY EFFECT

[75] Inventor: Sean D. Feenstra, South Sioux City, Nebr.

[73] Assignee: Gateway 2000, Inc., North Sioux City, S. Dak.

[21] Appl. No.: 710,579

[22] Filed: Sep. 19, 1996

[51] Int. Cl.$^6$ .................................................. H05K 7/20
[52] U.S. Cl. .................. 361/704; 165/80.3; 176/16.3; 257/707; 257/713; 361/690
[58] Field of Search ........................ 165/80.2, 80.3, 165/185, 908; 174/16.3; 257/706–707, 712–713, 721–722; 361/689, 690, 692, 693, 704, 707, 718–719, 722

[56] References Cited

U.S. PATENT DOCUMENTS

| | | | |
|---|---|---|---|
| 3,798,506 | 3/1974 | English | 317/100 |
| 3,961,666 | 6/1976 | Suzuki et al. | 165/129 |
| 4,042,903 | 8/1977 | Finegan, Jr. | 338/159 |
| 4,237,521 | 12/1980 | Denker | 361/384 |
| 4,296,455 | 10/1981 | Leaycraft et al. | 174/16.3 |
| 4,327,398 | 4/1982 | Christison | 361/384 |
| 4,481,525 | 11/1984 | Calabro et al. | 357/81 |
| 4,535,386 | 8/1985 | Frey, Jr. et al. | 361/389 |
| 4,803,380 | 2/1989 | Jacoby, Jr. et al. | 307/157 |
| 4,809,772 | 3/1989 | Kahr | 165/80.3 |
| 4,840,225 | 6/1989 | Foley et al. | 165/104.33 |
| 4,860,824 | 8/1989 | Foley et al. | 165/165 |
| 4,873,403 | 10/1989 | Counts et al. | 200/330 |
| 5,035,964 | 7/1991 | Levinson et al. | 429/120 |
| 5,170,310 | 12/1992 | Studtmann et al. | 361/94 |
| 5,260,730 | 11/1993 | Williams et al. | 353/122 |
| 5,269,372 | 12/1993 | Chu et al. | 165/80.4 |
| 5,285,350 | 2/1994 | Villaume | 361/690 |
| 5,315,477 | 5/1994 | Schumacher et al. | 361/678 |
| 5,351,748 | 10/1994 | Dagan | 174/16.3 |
| 5,367,444 | 11/1994 | Bornhorst et al. | 362/264 |

OTHER PUBLICATIONS

Connors "Variable-Area Heat Sink Device", IBM Tech Disclosure Bulletin, vol. 17, No. 4, Sep. 1974 (361/690).

Primary Examiner—Gregory D. Thompson
Attorney, Agent, or Firm—Schwegman, Lundberg, Woessner & Kluth, P.A.

[57] ABSTRACT

A heat sink that utilizes a chimney effect to create its own airflow provides heat dissipation without requiring a fan or an air flow passageway between the heat sink and the electronic component. By removing material from each one of a plurality of pipes attached to a base of the heat sink, air flow inlets are formed. Heat is dissipated from the heat sink by drawing air in through the air flow inlets, passing the air over a base heated by conduction and heating the air so that the air rises and exits out through an outlet in each of a plurality of pipes attached to the base. Heat is dissipated because of the pulling in and directing of air flow. Thus, the heat sink utilizes the cooling benefits of the chimney effect when the heat sink is placed directly on an electronic component and no air flow passageway exists below the heat sink.

12 Claims, 5 Drawing Sheets

HEAT SINK UTILIZING THE CHIMNEY EFFECT

FIELD OF THE INVENTION

The present invention relates to heat sinks and in particular to heat sinks for electronic components.

BACKGROUND OF THE INVENTION

Advances in semiconductor technology are creating increasing heat dissipation problems in electronic components and systems. Because electronic components have a relatively large amount of electrical current flow within an extremely small area, the components generate a substantial amount of heat. As electronic components get smaller and more powerful, they generate more heat in a smaller, more confined area. One component that generates more heat in a smaller area than its predecessors is the Intel Pentium Pro™ microprocessor. The effect of the heat generated is intensified by the close spacing of the components on printed circuit boards and the close spacing of printed circuit boards within electrical devices. Excessive heat degrades system performance and reliability, and can cause system failure. As a result, heat dissipation methods and devices are critical in the electronics industry.

A variety of well-known methods and devices for dissipating heat are available. These include various finned heat sinks which dissipate heat from the surfaces of metal fins. The finned heat sinks are attached to the electronic component to be cooled and are often used in computer systems with electric fans that drive air over the fins to enhance their cooling effect. The problem with these devices is that the electric fans take up precious space within the computer and add to their cost. Moreover, if the electric fan fails, then excess heat buildup within the computer can cause system failure.

One heat sink shown in U.S. Pat. No. 5,285,350 uses a chimney effect in which ducts through a thin plate covering an entire circuit board allow heated air to rise and hence create a draft or suction that draws cooler air inward through one end of the duct. Electronic devices on the circuit board are attached directly to the underside of the plate. The ventilation holes have short, tapering sides that act as chimneys to convect the heated air away from the electronic devices. To convect the heated air away, the ventilation holes of the heat sink must be located above the air flow passageways that exist between the electronic devices on the circuit board.

One problem with some heat sinks is that to provide the maximum heat dissipation a means for blowing air over the top of the heat sink is required or an air flow passageway under the heat sink is required. Accordingly, there is a need for a heat sink that provides better heat dissipation without requiring a fan or other means for blowing air over the top of the heat sink and without requiring an air flow passageway under the heat sink.

SUMMARY OF THE INVENTION

A heat sink that utilizes a chimney effect to create its own airflow provides heat dissipation without requiring a fan or an air flow passageway between the heat sink and the electronic component.

The heat sink has pipes attached to a thermal conductive base which is then attached to a device to be cooled. Air flow inlets are created near the point at which the pipes attach to the base or cover. Each one of the pipes has a side wall, a foundation and an outlet opposite the foundation. Material is removed from the side wall of the pipes to form the air flow inlets near the foundation. In addition, the pipes can be coupled to the base at an angle so that heated air rises through the pipes and exits out the outlet when the device is oriented vertically. In a further embodiment the pipes are directly coupled to a module cover of an electronic device.

The chimney effect refers to the natural flow of air created as heated air rises in the pipes and creates a draft or suction that draws cooler air inward from the inlets near the foundation of the pipes. The chimney effect dissipates heat from the heat sink by convective cooling. The heat sink of the present invention creates a natural flow of air over the surface of the heat sink by drawing air in through the air flow inlets in each of the pipes and expelling air out through the outlet.

In operation, the base and the pipes on the heat sink provide conductive cooling when thermally coupled to an electronic component. A chimney effect is created by drawing air in through the air flow inlets, passing the air over the heated base and heating the air so that the air rises and exits out through the outlet in each of the of pipes. The chimney effect dissipates heat from the heat sink by convective cooling.

The present invention eliminates the need for a fan to blow air over the top of the heat sink. The heat sink of the present invention creates a natural flow of air over the top surface of the heat sink by drawing air in through the air flow inlets in each of the pipes and expelling air out through the outlet. Thus, the heat sink of the present invention can convect heat away from the surface of the heat sink without independently blowing air over the top of the heat sink.

The present invention can also utilize the cooling benefits of the chimney effect when the heat sink is placed directly on an electronic component and there is no air flow passageway below the base of the heat sink. By removing material from each one of the pipes to form air flow inlets, air from above the base of heat sink can be drawn in through the air flow inlets. The chimney effect increases the flow of air over the electronic component and increases the cooling rate without need for an air flow passageway below the base.

The above and still further features and benefits of the present invention will become apparent upon consideration of the following detailed description and the accompanying drawings.

DESCRIPTION OF THE EMBODIMENTS

In the following detailed description of the embodiments, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present inventions. The following detailed description is, therefore, not to be taken in a limiting sense, and the scope of the present inventions is defined only by the appended claims. Numbering in the Figures is done so that identical components which appear in multiple figures are identified by the same reference numbers.

Figure 1:
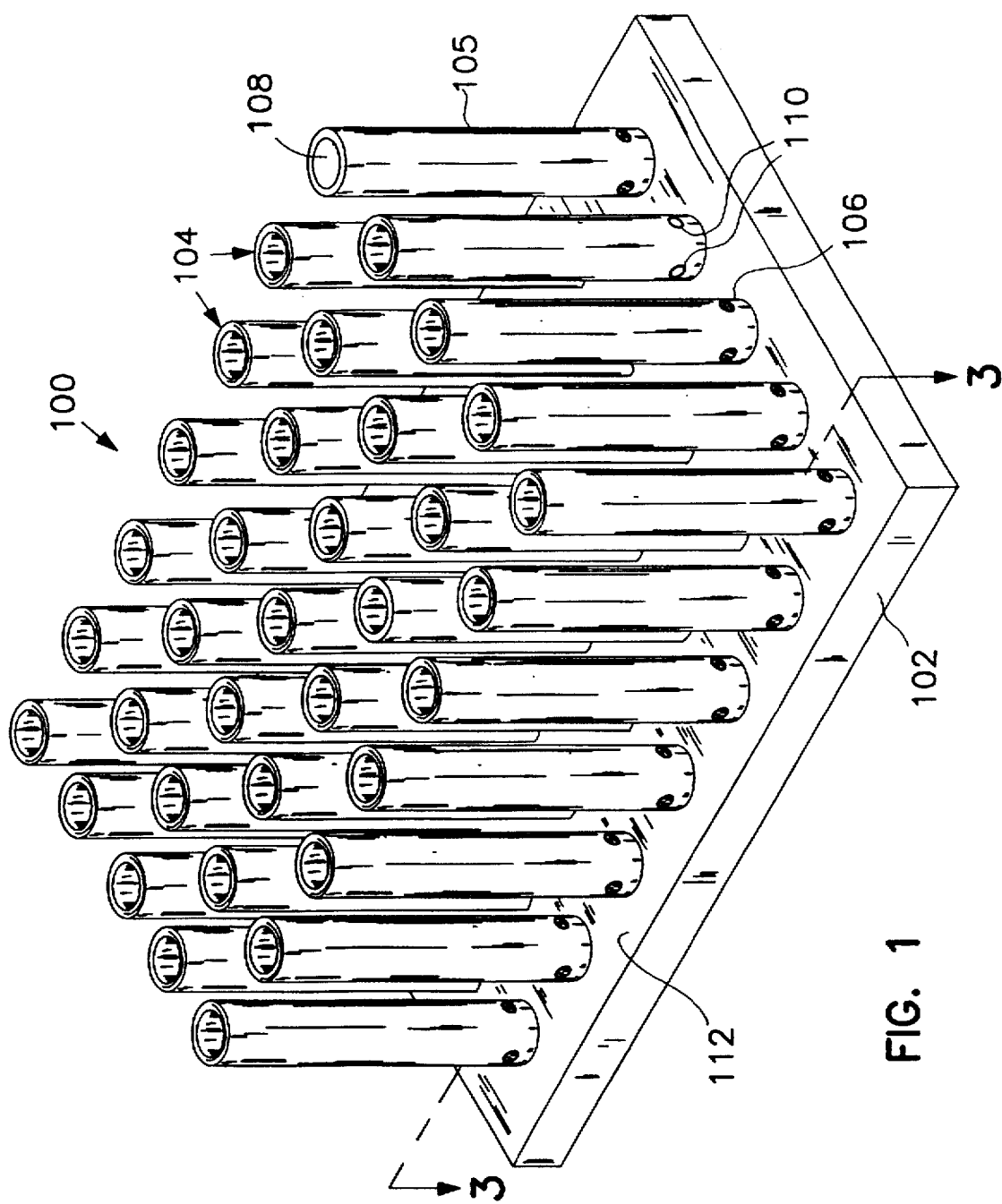
FIG. 1 is a perspective view of one embodiment of a heat sink according to the present invention.

FIG. 1 is a perspective view of one embodiment of a heat sink according to the present invention. The heat sink 100 comprises a base 102 and a plurality of pipes 104. Each one of the plurality of pipes 104 comprises a side wall 105, a foundation 106, an outlet 108 and at least one of air flow inlet 110.

In operation, when the heat sink shown in FIG. 1 is thermally coupled to an electronic component to be cooled, heat is transferred from the electronic component to the base 102 of the heat sink by conduction. The electronic component can be a CPU, an integrated circuit or a combination of integrated circuits on a printed circuit board. The base 102 of the heat sink is thermally coupled to the electronic component by metal clamps used in conjunction with a flux pad placed between the CPU and the heat sink. This method of coupling the heat sink to an electronic component is well known to those skilled in the art. Other thermal coupling methods such as heat conductive tape or glue can be used instead. The coupling allows the thermal energy to be transferred by conduction from the electronic component to the heat sink.

Next, the heat is dissipated from the heat sink to the surrounding air by convection and radiation. The heat sink creates a flow of air over a top side 112 of the heat sink by drawing air in through the air flow inlets 110 in each of the pipes 104, passing the air over the heated base 102 and heating the air so that the air rises and exits out through the outlet 108 in each of the pipes 104. As the heated air rises in the pipes 104, the upward movement of the heated air draws in cool air through the air flow inlets 110 creating a chimney effect. The chimney effect refers to the natural flow of air created as heated air rises in the pipes 104 and creates a draft or suction that draws cooler air inward from the inlets 110 near the foundation of the pipes 104. As a result, a flow of air is created over the surface of the heat sink to dissipate heat. The flow of air dissipates heat from the heat sink as the air is drawn over the top side 112 of the heat sink and as the air flows through each one of the pipes 104.

Figure 6:
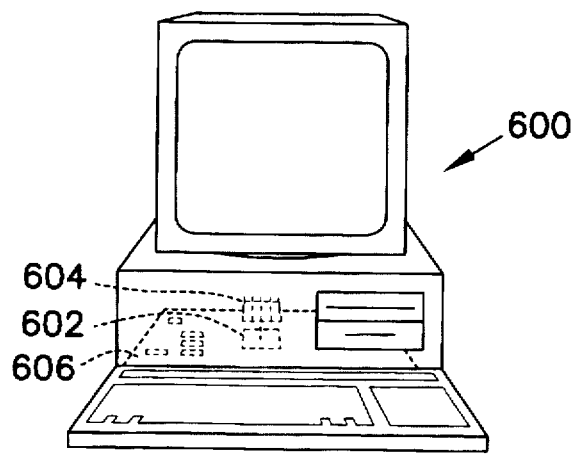
FIG. 6 is a perspective view of a personal computer on which the present invention can be implemented.

The description of the embodiment shown in FIG. 1 includes as an example the dimensions for a heat sink designed to cool a Intel Pentium Pro™ microprocessor used in a Gateway model G6 personal computer as shown in FIG. 6. FIG. 6 illustrates an exemplary personal computer 600 on which the present invention can be implemented. The exemplary personal computer 600 includes a central processing unit 602, a heat sink 604 coupled to the central processing unit 602 and a memory 606.

In the embodiment shown in FIG. 1, the base 102 is approximately the same length and width as the electronic component the heat sink is cooling. Therefore, the length and width of the base 102 vary depending on the size and shape of the electronic component to be cooled. Electronic components likely to be cooled by the heat sink include a central processing unit of a computer, an integrated circuit or a combination of integrated circuits on a printed circuit board. If, for example, the heat sink is used to cool an Intel Pentium Pro™ microprocessor, the dimensions of the base 102 are about 64.0 mm by about 77.0 mm. However, the heat sink 100 is not limited to these dimensions and can have other shapes or cover more than one electronic component.

In the embodiment shown in FIG. 1, the thickness of the base 102 is about 3.0 mm. The base 102 is made of a thermal conductive material such as aluminum. Other materials with the appropriate characteristics can also be used for the base 102. For example, copper or a thermal graphite polymer such as Thermalgraph™, which is produced by Amoco, can be used for the base 102.

In one embodiment the base 102 and a plurality of solid columns are molded out of extruded aluminum as a single unit. Then, the plurality of air flow inlets 110 are formed by using a drill to remove material from the side wall 105 of each of the solid columns. Finally, the plurality of pipes 104 are created by holding the unit in a metal jig and drilling out material from each of the solid columns to form hollow pipes 104.

Figure 2:
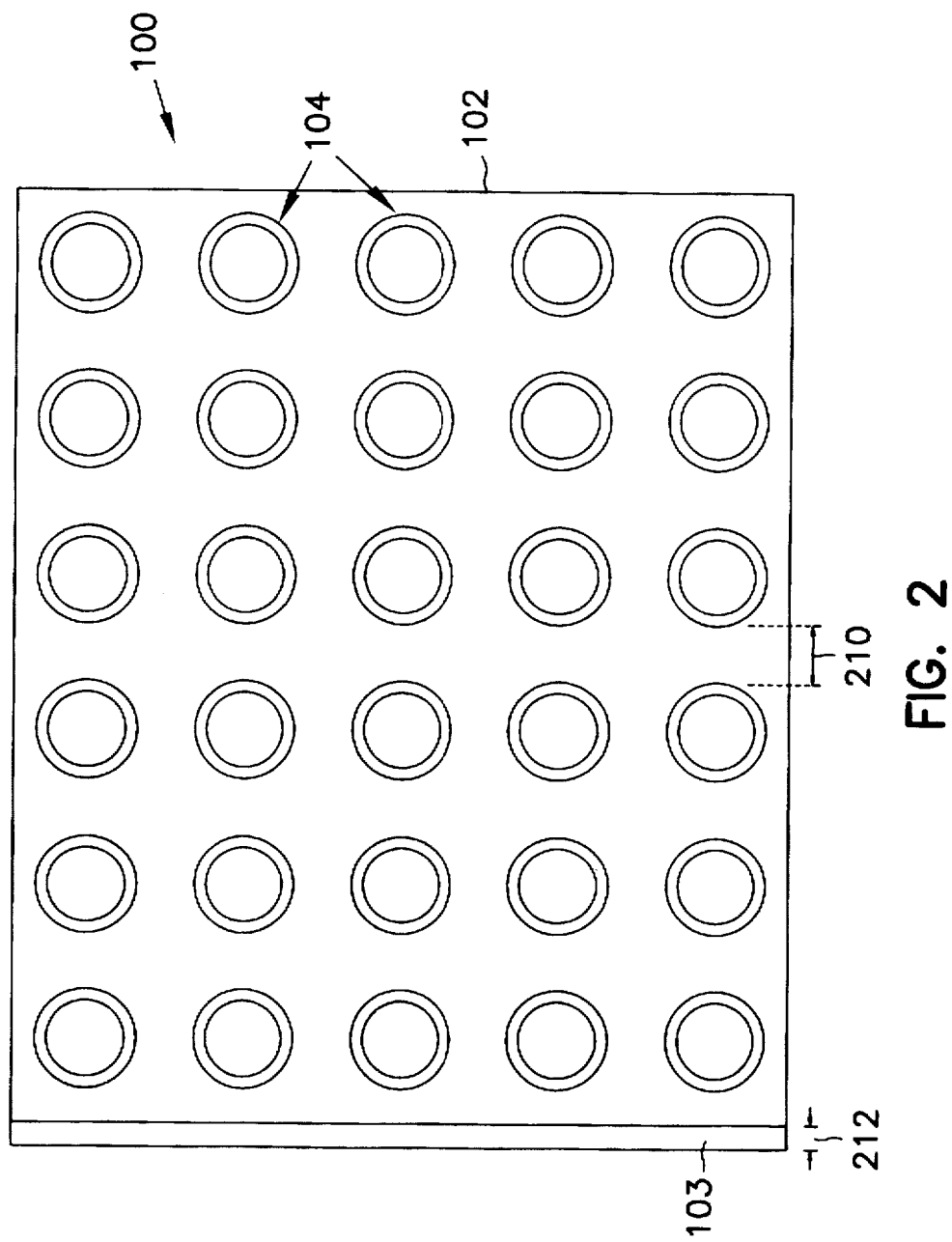
FIG. 2 is a top plan view of the heat sink in FIG. 1.

FIG. 2 is a top plan view of the heat sink in FIG. 1. Each one of the plurality of pipes 104 is coupled to the base 102. The plurality of pipes 104 are disposed on the base 102 of the heat sink 100 in a pattern of rows. Each one of the plurality of pipes 104 is spaced about 5.0 mm from each adjacent pipe as indicated at 210. In the example of a heat sink designed to cool an Intel Pentium Pro™ microprocessor, between about 30 and 35 pipes 104 are arranged in rows on the base 102. Other alternate embodiments having other configurations and different numbers of pipes 104 are contemplated and are within the scope of the invention.

FIG. 2 also shows a lip 103 which is used in one embodiment when coupling the base 102 to an Intel Pentium Pro™ microprocessor. The lip 103 is about 2.0 mm wide as indicated at 212.

Figure 5:
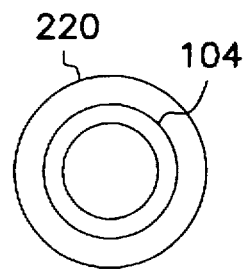
FIG. 5 is a top plan view of an alternative heat sink pipe.

In an alternate embodiment, shown in FIG. 5 the plurality of pipes 104 are directly coupled to the module cover of an electronic component rather than to the base 102. The foundation 106 of each one of the plurality of pipes 104 projects outward in the shape of a flange 220 or multiple flange portions such as tabs. The foundation 106 and flange or tabs 220 of each one of the plurality of pipes 104 is glued or otherwise attached such as with a thermal conductive glue directly to the module cover. The flange 220 extends from the pipe 104 in a direction parallel to the surface of the module cover to conform to the shape of the module cover and offer a suitable surface area for sufficient coupling.

Figure 3:
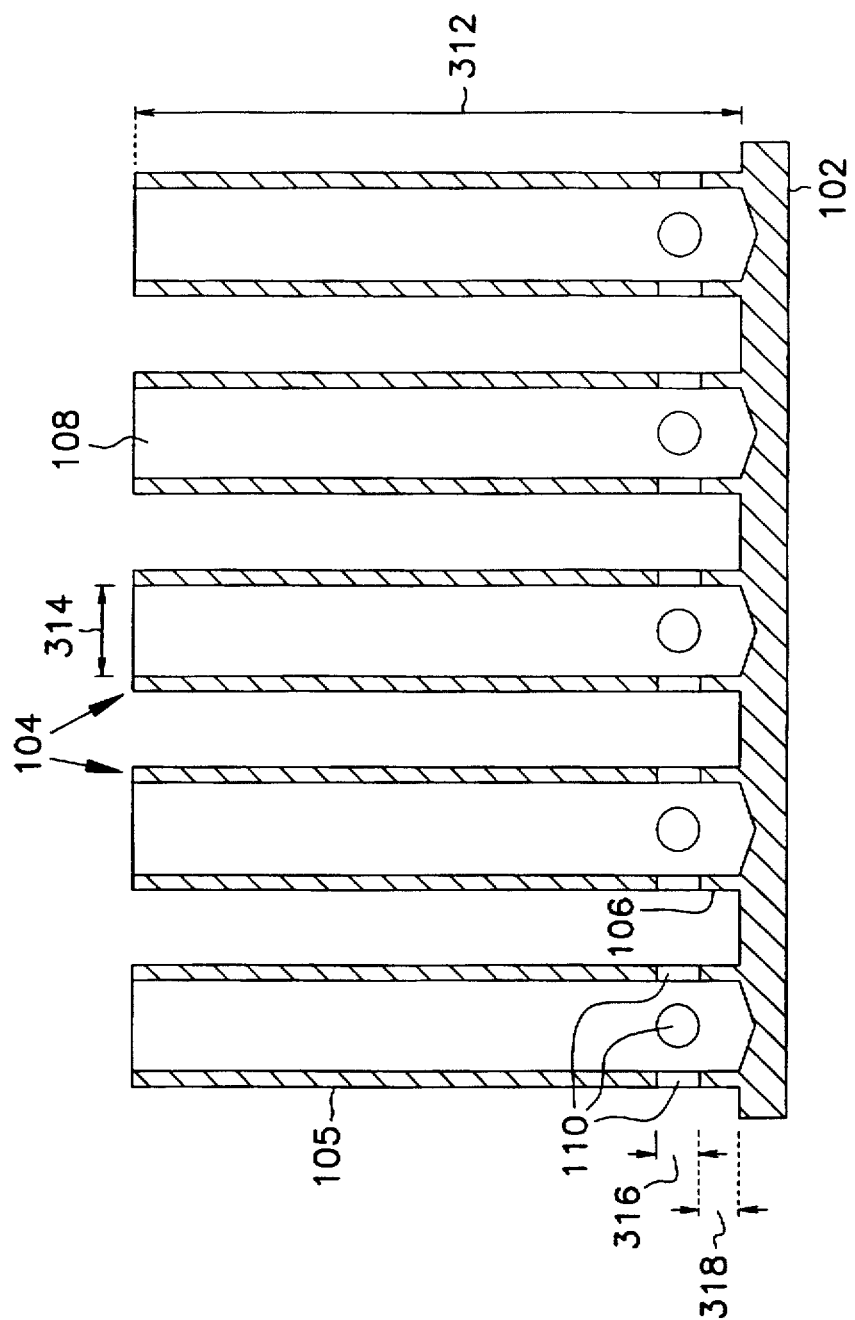
FIG. 3 is a cross-sectional view of the heat sink in FIG. 1 through line 3—3 of FIG. 1.

FIG. 3 is a cross-sectional view of the heat sink in FIG. 1 taken through line 3—3 of FIG. 1. Each one of the plurality of pipes 104 is substantially cylindrical in cross section. The height 312 of each one of the pipes 104 is about 40.0 mm. The diameter 314 of the outlet 108 of each one of the pipes 104 is about 6.0 mm. In an alternate embodiment each one of the plurality of pipes 104 has multiple sides forming a rectangular, hexagonal or octagonal cross-section. In a further embodiment each one of the plurality of pipes 104 has corrugated sides with alternating ridges and grooves. Alternate embodiments having different cross-sections are contemplated and are within the scope of the invention.

Each one of the plurality of pipes 104 has a foundation 106, a side wall 105 and an outlet 108. The foundation 106 of the pipe is coupled to the base 102. The side wall 105 is formed of a thermally conductive material such as aluminum. Other materials can also be used for the side wall 105 such as copper or a thermal graphite polymer such as Thermalgraph™.

Each one of the pipes 104 has material removed from the side wall 105 to form a plurality of air flow inlets 110. The air flow inlets 110 are substantially located near the foundation 106 and are placed at about 90 degree intervals around the circumference of a cylindrical pipe. In the embodiment of the heat sink designed to cool an Intel Pentium Pro™ microprocessor, four air flow inlets 110 are located on each pipe 104 near the base such that the desired airflow occurs. The diameter 316 of each one of the air flow inlets 110 is about 2.9 mm and the air flow inlets 110 are located about 2.5 mm above the base 102 as indicated by dimension 318. In an alternate embodiment each one of the air flow inlets 110 is arch shaped and located on the edge of the foundation 106. However, depending on the electronic component to be cooled, alternate embodiments with the air flow inlets 110 arranged in different configurations and with a different number of air flow inlets and height above the base are within the scope of the invention.

Figure 4:
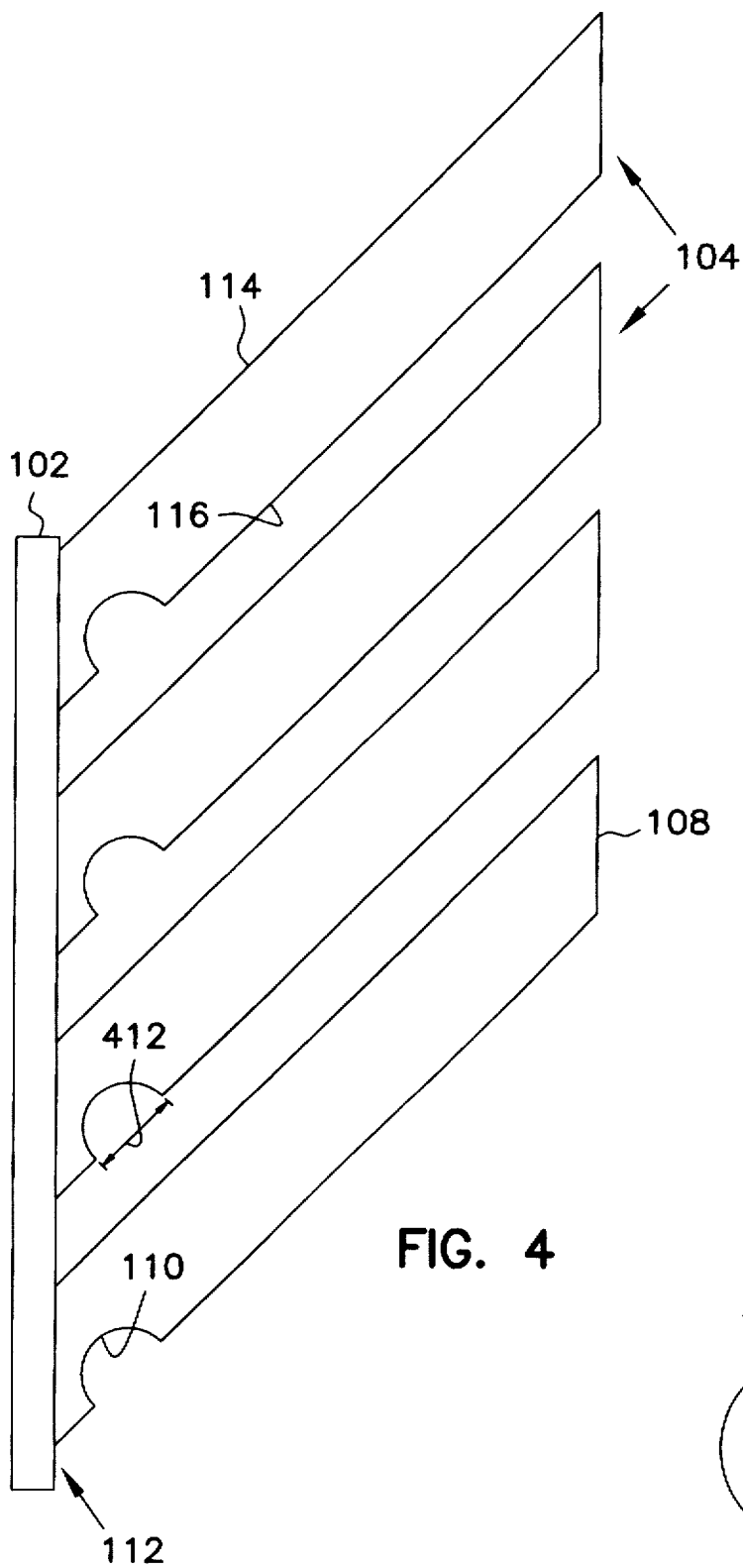
FIG. 4 is a side elevation view of an alternate embodiment of the heat sink according to the present invention.

FIG. 4 is a side view of an alternate embodiment of the heat sink according to the present invention. Each one of the pipes 104 is coupled at an angle to the base 102 so that heat rises upward through the outlet 108 when the top side 112 of the heat sink 100 is oriented vertically. Each one of the pipes 104 in the embodiment shown in FIG. 4 has an upwardly facing surface 114 and a downwardly facing surface 116. When the top side 112 of the heat sink is oriented vertically, the pipes 104 are coupled to the base 102 so that the upwardly facing surface 114 of each one of the pipes 104 is at about a 45° angle to the base 102. In the embodiment of the heat sink designed to cool an Intel Pentium Pro™ microprocessor, only one air flow inlet 110 is located on each one of the plurality of pipes 104. The air flow inlet 110 is substantially located on the downwardly facing surface 116 of each one of the pipes 104. The diameter 412 of each one of the air flow inlets 110 is about 6.3 mm.

Other mechanisms for dissipating heat will be apparent to those skilled in the art, as will the use of alternate materials and manufacturing methods for making It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A heat sink for cooling an electronic component which generates heat, the heat sink comprising:

a base, the base having a predetermined thickness; and at least one pipe wherein the pipe comprises a side wall, a foundation coupled to the base and an outlet opposite the foundation, the pipe having material removed from the side wall only near the base to form at least one air flow inlet so that when the heat sink is coupled to the electronic component, the heat is dissipated by a flow of air.

2. The heat sink as claimed in claim 1, wherein the pipe is substantially cylindrical.

3. The heat sink as claimed in claim 2, wherein a plurality of air flow inlets are placed at about 90 degree intervals around the circumference of each one of a plurality pipes.

4. The heat sink as claimed in claim 1, wherein the heat sink is composed of a thermal conductive material.

5. A heat sink for cooling an electronic component which generates heat, the heat sink comprising:

a base; and at least one pipe wherein the pipe comprises a side wall, a foundation coupled to the base, and an outlet opposite the foundation, the pipe having material removed from the side wall only near the foundation to form at least one air flow inlet so that when the heat sink is coupled to the electronic component with the outlet higher than the inlet, the heat is dissipated by a flow of air from the inlet to the outlet.

6. The heat sink as claimed in claim 5, having a single air flow inlet located near the foundation and on the downwardly facing surface of the side wall.

7. The heat sink as claimed in claim 5, comprising a plurality of pipes which are substantially cylindrical.

8. A heat sink for cooling an electronic component which generates heat, the heat sink comprising:

a plurality of pipes wherein each one of the plurality of pipes comprises a side wall, a foundation adapted to be coupled directly to the electronic component, and an outlet opposite the foundation, each one of the plurality of pipes having material removed from the side wall only near the foundation to form a plurality of air flow inlets so that when the heat sink is coupled to the electronic component, the heat is dissipated by a flow of air.

9. The heat sink of claim 8 wherein the foundation comprises at least one flange portion which is generally parallel to the surface of a module cover containing the electronic component.

10. A computer system which incorporates a heat sink, the computer system comprising:

a central processing unit;

a memory coupled to the central processing unit; and a heat sink coupled to the central processing unit, the heat sink comprising a base, the base having a predetermined thickness, and a plurality of pipes wherein each one of the plurality of pipes comprises a side wall, a foundation coupled to the base and an outlet opposite the foundation, each one of the plurality of pipes having material removed from the side wall only near the foundation to form a plurality of air flow inlets so that when the heat sink is coupled to an electronic component generating heat, the heat is dissipated by a flow of air.

11. A method of dissipating heat from an electronic device, the method comprising the steps of:

thermally coupling the electronic device with a heat sink;

providing conductive cooling to transfer heat from the electronic device to the heat sink utilizing a base having a predetermined thickness and a plurality of pipes having a foundation coupled to the base; and providing convective cooling by creating a chimney effect from air drawn in through a plurality of air flow inlets only near the foundation in each of the plurality of pipes on the base and exited out an outlet in each of the plurality of pipes to dissipate heat.

12. The method of dissipating heat claimed in claim 11, wherein the step of providing convective cooling further comprises drawing air over a top side of the base.

* * * * *